(12) United States Patent
Pillai et al.

(10) Patent No.: US 6,680,530 B1
(45) Date of Patent: Jan. 20, 2004

(54) MULTI-STEP TRANSMISSION LINE FOR MULTILAYER PACKAGING

(75) Inventors: Edward R. Pillai, Wappingers Falls, NY (US); Warren D. Dyckman, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/217,822

(22) Filed: Aug. 12, 2002

(51) Int. Cl.$^7$ .................. H01L 23/12; H01L 23/043
(52) U.S. Cl. .................. 257/700; 257/691; 257/708; 257/635; 257/621; 257/664
(58) Field of Search .................. 257/700, 691, 257/708, 635, 621, 664

(56) References Cited

U.S. PATENT DOCUMENTS

| | | | |
|---|---|---|---|
| 5,114,780 A | 5/1992 | Mercer et al. | |
| 5,192,716 A | 3/1993 | Jacobs | |
| 5,502,333 A | * 3/1996 | Bertin et al. | ................ 257/685 |
| 5,530,287 A | * 6/1996 | Currie et al. | ................ 257/692 |
| 5,623,160 A | 4/1997 | Liberkowski | |
| 5,637,920 A | 6/1997 | Loo | |
| 5,744,758 A | 4/1998 | Takenouchi et al. | |
| 5,861,670 A | 1/1999 | Akasaki | |
| 5,886,406 A | * 3/1999 | Bhansali | ................ 257/698 |
| 5,965,043 A | 10/1999 | Noddin et al. | |
| 5,998,861 A | 12/1999 | Hiruta | |
| 6,008,534 A | * 12/1999 | Fulcher | ................ 257/691 |
| 6,054,758 A | * 4/2000 | Lamson | ................ 257/691 |
| 6,285,080 B1 | 9/2001 | Bezama et al. | |
| 6,301,121 B1 | 10/2001 | Lin | |
| 6,324,067 B1 | 11/2001 | Nishiyama | |
| 6,384,477 B2 | * 5/2002 | Yoon et al. | ................ 257/697 |
| 6,433,412 B2 | * 8/2002 | Ando et al. | ................ 257/687 |
| 6,535,398 B1 | * 3/2003 | Moresco | ................ 361/792 |
| 6,537,849 B1 | * 3/2003 | Tsai et al. | ................ 438/106 |
| 6,541,850 B2 | * 4/2003 | Duesman et al. | ................ 257/691 |

FOREIGN PATENT DOCUMENTS

JP 63-29258 * 3/1986 ................ 257/691

* cited by examiner

Primary Examiner—Jasmine Clark
(74) Attorney, Agent, or Firm—James J. Cioffi

(57) ABSTRACT

In packaging integrated circuits for high speed (multi-gigabit) applications, chip carriers having signal paths between the substrate board and the chips at the top with a number of evenly divided vertical steps produces frequency properties that are sufficiently good that it is possible to run signals through the package, rather than by means of connectors attached to the top surface of the carrier.

23 Claims, 4 Drawing Sheets

MULTI-STEP TRANSMISSION LINE FOR MULTILAYER PACKAGING

TECHNICAL FIELD

The field of the invention is that of packaging integrated circuits for high speed applications.

BACKGROUND OF THE INVENTION

In the field of integrated circuit packaging, high performance packages are often formed from layers of ceramic that are pressed together with metal embedded in it. The embedded metal is positioned so that it forms a set of interconnections in the final product, carrying signals from the substrate to the chips mounted on its top surface. Conventionally, in order to have the minimum number of connections, any vertical transitions that are required will be accomplished in a single step. An example is given in FIG. 4, in which a lower horizontal interconnect 152' is connected to an upper interconnect 152' through via 20 151'.

Those skilled in the art are aware that an impedance mismatch is present at the transition between the horizontal runs and the vertical, caused by geometry and by a difference in materials. The magnitude of this impedance mismatch depends on the frequency of the signal being carried and, in some cases, can result in reflections that effectively cancel an incoming signal or feed back into other parts of the circuit.

As signal switching speeds have increased, the art has devised more sophisticated and expensive structures to carry signals and remove heat to and from integrated circuits. With present technology, it is not possible to run signals in the gigabit range through the bulk of a ceramic chip carrier with acceptable frequency response. The art has been required to use connectors attached to transmission lines running in a single plane, at considerable cost and subject to tight space limits.

Edge or surface mount connectors have been used to provide acceptable performance, but cost more to implement and only a very limited number can be used due to real estate constraints on the top surface.

SUMMARY OF THE INVENTION

The invention relates to a multi-layer chip carrier that makes vertical transitions in signal paths through a number of small steps, rather than a single larger step.

A feature of the invention is the use of a set of horizontal signal lines extending through the package and disposed on the interlayer surfaces of the set of ceramic sheets, in which at least one of the signal lines has at least three horizontal segments connected by at least two vias.

DETAILED DESCRIPTION

Figure 1:
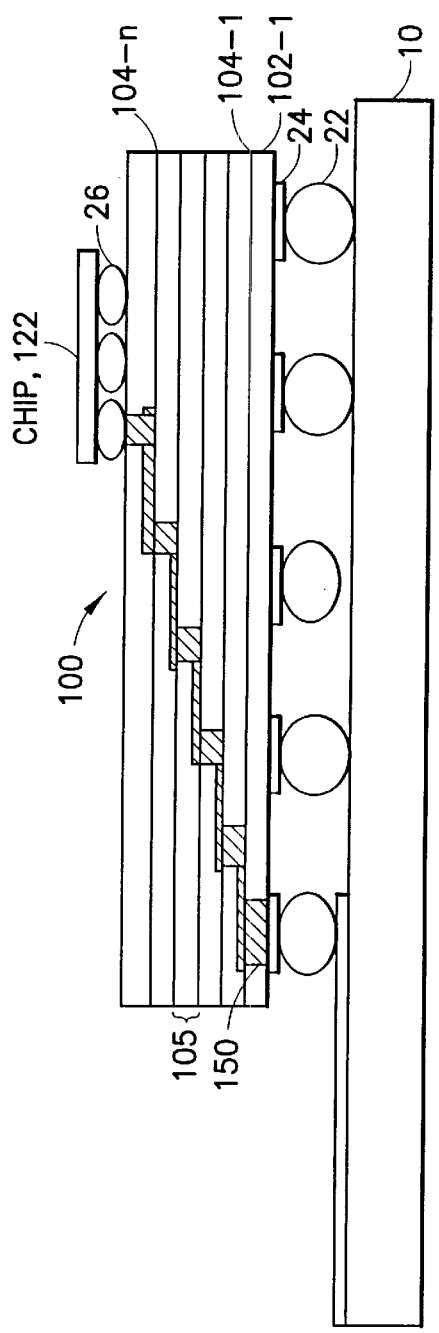
FIG. 1 shows in partially pictorial, partially schematic form a simplified version of a carrier for an integrated circuit.

FIG. 1 shows in cross section a simplified portion of a ceramic chip carrier 100, positioned on substrate 10 and holding integrated circuit 122. At the bottom, a bottom ball grid array of balls 22 interfaces between the substrate and the chip carrier and at the top, top ball grid array of balls 26 does the same thing. Those skilled in the art will be aware that the transition between the horizontal conductors on the surface of substrate 10 through ball 22 and bond pad 24 to the first via 150 will necessarily involve more or less of an impedance mismatch. There will be, here and at other places in the package, the need for a design choice as to how much of a mismatch can be tolerated and how much expense should be made to improve the impedance matching. Package 100 is composed of a set of layers of which the lowest layer is labeled 102-1, typically about 12 in number with interlayer surfaces at interfaces 104-1 to 104-n. In contemporary practice, the layers are typically ceramic 100 micron thick and hold metal strips that are nominally 30 micron thick. Vias between horizontal signals lines are typically 100 μm in diameter. The dimensions will be selected for impedance matching, typically at 50 ohms.

Figure 2:
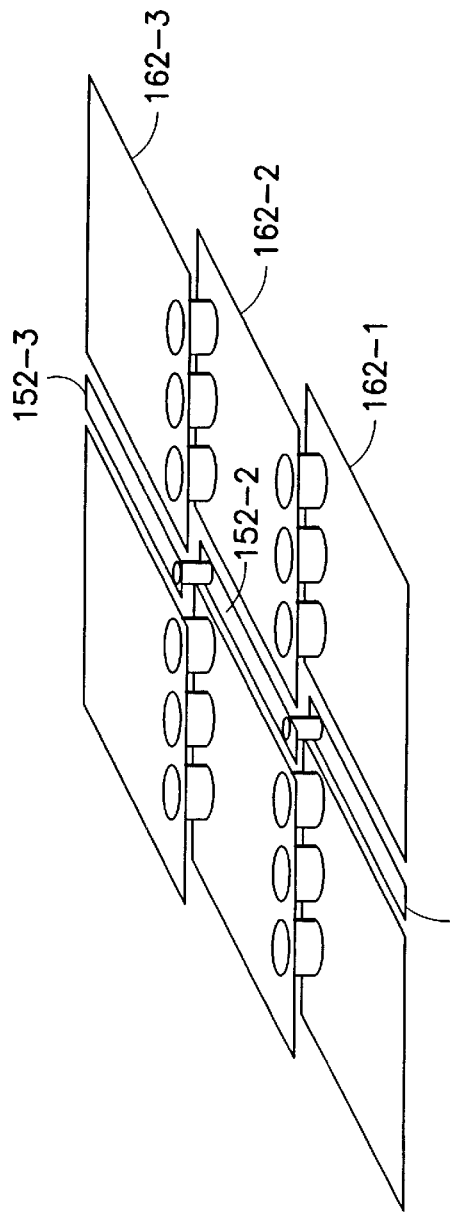
FIG. 2 shows a portion of the carrier of FIG. 1 in perspective.

FIG. 2 illustrates in perspective a portion of a signal line according to the invention, as used in FIG. 1, in which lines 152-1, 152-2 and 152-3 are disposed between sheets (ground planes) 162-1, 162-2 and 162-3, again with the dimensions set to produce 50 ohm impedance. Dimensions between the signal lines and the ground planes to produce the required impedance are well known.

Those skilled in the art would not choose to use a set of vias as shown in FIGS. 1 and 2 because, as is well known, the risk of misalignment, defective filling of apertures in forming the vias and other manufacturing errors increases as the number of connections increases.

At each vertical transition, there is a finite probability of an open circuit (caused by misalignment or by a residual layer of insulating material) and/or a short circuit caused by material from the line or via making contact with an adjacent line. Using a single vertical member also frees up area in the chip carrier for other purposes.

It has been found that substantial improvement in signal quality is possible if the signal is run through a "staircase" structure such as that shown in FIGS. 1 and 2, in which a set of evenly divided vertical steps substitute for the single step of the prior art. Preferably, a typical run between the substrate and the chip connection of 25 to 15 mm will have at least 12 horizontal runs and 11 vertical steps, including the steps connecting the top and bottom ball grid arrays.

The prior art has taken the view that the less the number of steps the better the quality of transmission, since reflections are caused at every step. According to the invention, however, increasing the number of steps does not cause an adverse effect either since the small reflections at each step are attenuated on their return to the chip driver circuit. The step size is preferably kept to about 1/10 wavelength (about 200 micron for present technology) and below to contain the magnitude of the reflection. The overall length of the trace including the steps is kept within the same limits as the prior art to minimize signal power loss.

Figure 3:
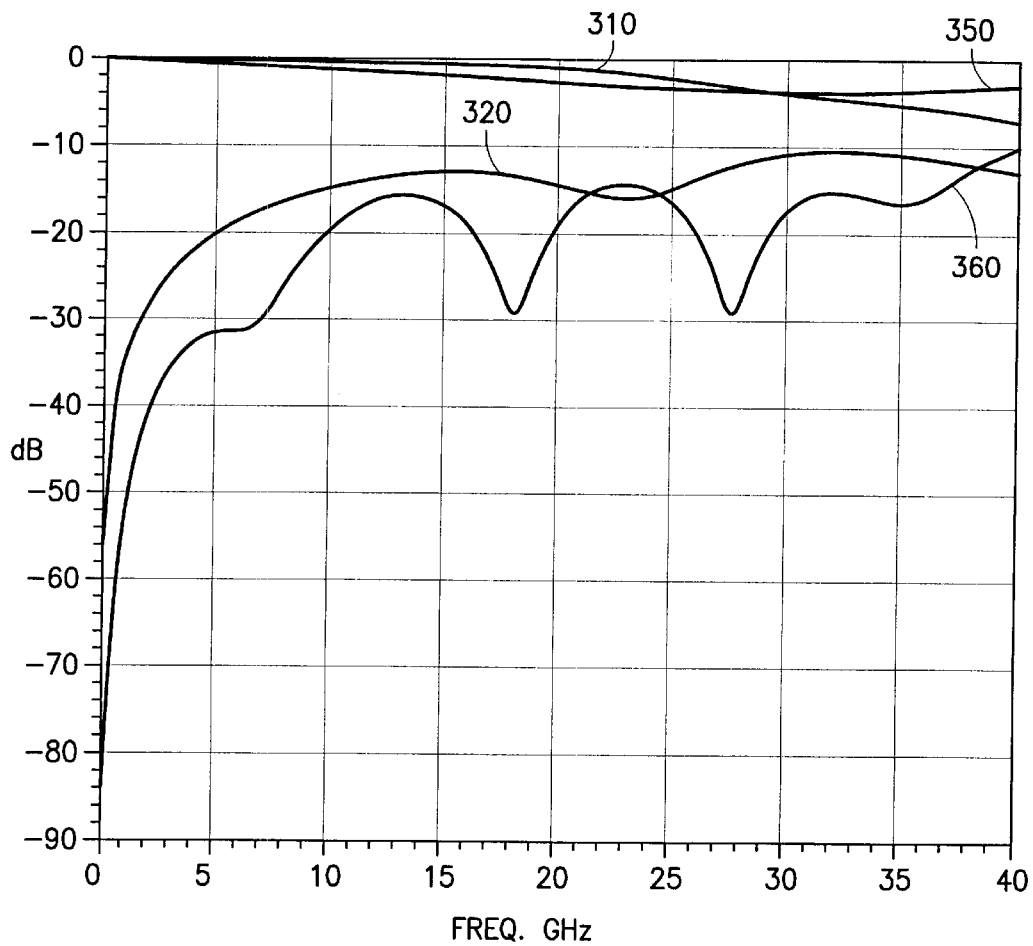
FIG. 3 shows the frequency dependence of the invention compared with the prior art.
Figure 4:
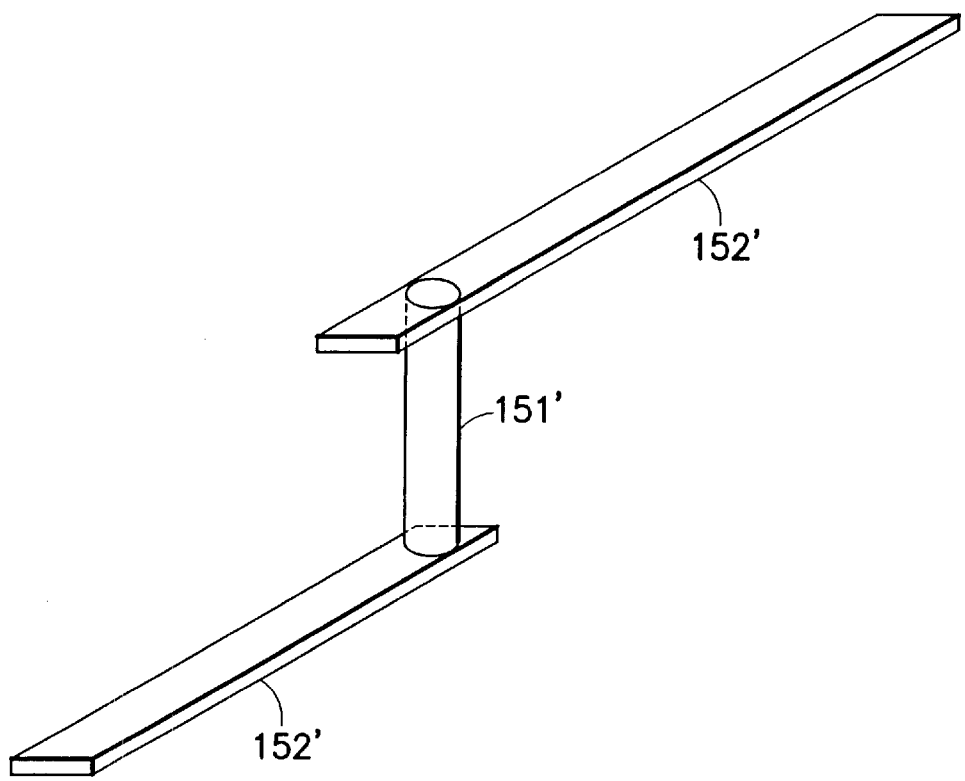
FIG. 4 shows a portion of a prior art carrier.

FIG. 3 illustrates frequency dependence of a single vertical step versus a multi-step line according to the invention. Curves 310 and 350 show return loss as a function of frequency for a prior art structure such as that shown in FIG. 4 and for a structure according to the invention.

Curves 350 and 360 show return loss and insertion loss, for a structure according to the invention comprising a set of 12 horizontal runs averaging 1 mm in length connected by 11 vertical vias. Dimensions were sized for 50 ohm impedance. The balls in the bottom and top arrays were 0.1 mm and 0.5 mm in diameter, respectively. Those skilled in the art will appreciate that the (nominally 10 db) dips in curve 360 are acceptable and far superior to the properties of a conventional one-step run through the package. Such a one-step run is not shown, because its performance would be unacceptable. Only a much more labor-intensive and expensive one-step structure would have acceptable frequency properties. Curves 350 and 360 show the properties of an entire run, including the effect of the ball contact at the bottom of the package and therefore are less favorable than a curve taken with only the multi-step signal line according to the invention.

Figure 5:
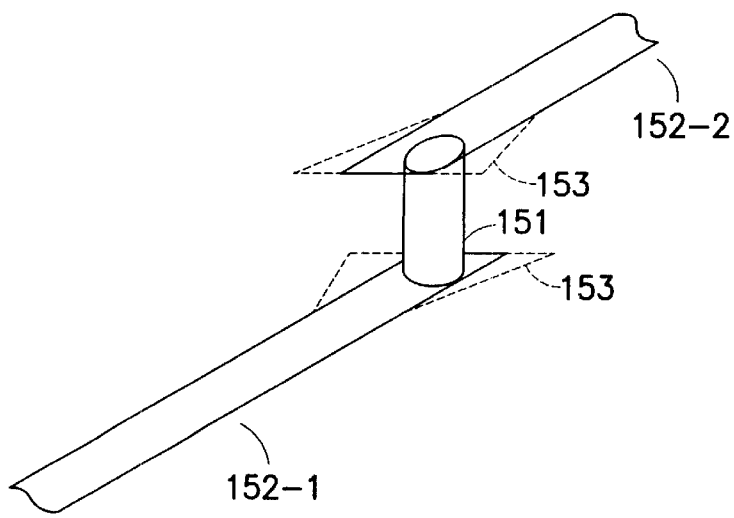
FIG. 5 shows an alternative embodiment employing capacitive compensation.

1. Referring now to FIG. 5, an upper horizontal segment 152-2 and a corresponding lower segment 152-1 are connected by via 151. In this version, both the upper and lower segments have been widened in the vicinity of the via, as shown by dotted lines 153. This increases the capacitance in the region of the via to compensate for the inductance of the via. The increase in the nominal width of the horizontal members will depend on both the inductance of the via, [which, in turn, depends on the via dimensions] and also on the capacitance between the horizontal member and neighboring conductive elements.

This increase in width also applies to the interface with external contacts, such as balls 22 in FIG. 1. These factors will vary in each case. Those skilled in the art will be able to set their own parameters to accommodate different circumstances and to maintain their design impedance.

Figure 6:
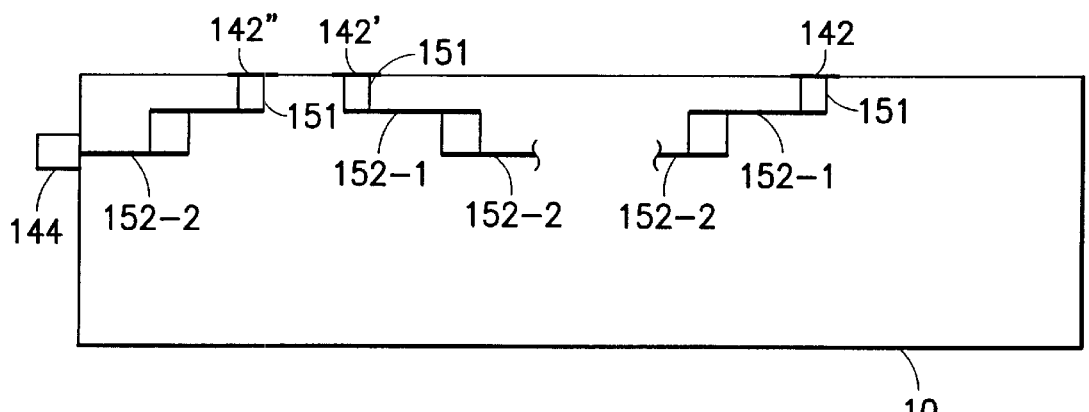
FIG. 6 shows different geometrical versions.

FIG. 6 shows in cross section two different versions of the invention. At the right side, a contact 142 on the top of the package connects to via 151 that connects to horizontal member 152-1. That, in turn, descends another step through another via 151 to the next level, 152-2. In the center of the Figure, counterpart members 152-2 and 152-1, connected by vias 151 rise to contact 142'. In this case, the invention has been applied to a top-to-top connection, e.g. between different integrated circuits on the same package; between two contacts on the same chip; between a chip and an external resistor or other component, etc.

On the left of FIG. 6, contact 142" is connected through two vias 151 and two horizontal members to an external contact 144. Box 144 represents a co-axial connector, strip connector, metal contact, etc. This arrangement provides an option for different connection schemes.

While the invention has been described in terms of a single preferred embodiment, those skilled in the art will recognize that the invention can be practiced in various versions within the spirit and scope of the following claims.

What is claimed is:

1. A package for an integrated circuit comprising a set of dielectric layers having a top surface, a bottom surface and a plurality of interlayer surfaces; a top contact array attached to said top surface; a set of conductive signal lines extending through said package to a set of output contacts and disposed on said plurality of interlayer surfaces; in which at least one of said plurality of signal lines comprises at least three horizontal segments on at least two interlayer surfaces connected by at least two vias extending vertically from the same horizontal segment at different horizontal locations between two of said interlayer surfaces, whereby signals on said signal line make at least two transitions between said horizontal segments.

2. A package according to claim 1, in which said package comprises N dielectric layers and in which at least one signal line comprises N vias, each of said N vias passing through a single dielectric layer.

3. A package according to claim 1, in which at last one of said horizontal segments has an increased width in proximity to a via such that increased capacitance compensates for via inductance.

4. A package according to claim 1, in which at least one signal line originates and terminates on a member of said top contact array, thereby connecting two members of said top contact array through said package.

5. A package according to claim 1, in which at least one signal line terminates on a contact on a vertical face of said package.

6. A package according to claim 3 in which at least one signal line terminates on a contact on a vertical face of said package.

7. A package for an integrated circuit comprising a set of dielectric layers having a top surface, a bottom surface and a plurality of interlayer surfaces; a top contact array attached to said top surface; a set of conductive signal lines extending through said package to a set of output contacts and disposed on said plurality of interlayer surfaces; in which at least one of said plurality of signal lines comprises at least three horizontal segments on at least three surfaces connected by at least two vias extending vertically between two of said interlayer surfaces, in which at least two of said horizontal segments have substantially the same length.

8. A package according to claim 7, in which at last one of said horizontal segments has an increased width in proximity to a via such that increased capacitance compensates for via inductance.

9. A package according to claim 7, in which at least one signal line originates and terminates on a member of said top contact array, thereby connecting two members of said top contact array through said package.

10. A package according to claim 7, in which at least one signal line terminates on a contact on a vertical face of said package.

11. A package for an integrated circuit comprising a set of dielectric layers having a top surface, a bottom surface and a plurality of interlayer surfaces; a top contact array attached to said top surface; a bottom contact array attached to said bottom surface; a set of conductive signal lines extending through said package and disposed on said plurality of interlayer surfaces; in which at least one of said plurality of signal lines comprises at least three horizontal segments on at least three surfaces connected by at least two vertical members extending vertically from the same horizontal segment at different horizontal locations between two of said interlayer surfaces, whereby signals on said signal line make at least two transitions between said horizontal segments.

12. A package according to claim 11, in which at least one signal line originates and terminates on a member of said top contact array.

13. A package according to claim 11, in which at least one signal line terminates on a contact on a vertical face of said package.

14. A package for an integrated circuit comprising a set of dielectric layers having a top surface, a bottom surface and a plurality of interlayer surfaces; a top contact array attached to said top surface;
   a bottom contact array attached to said bottom surface;
   a set of conductive signal lines extending through said package and disposed on said plurality of interlayer surfaces;
   in which at least one of said plurality of signal lines comprises at least three horizontal segments on at least three surfaces connected by at least two vertical members extending vertically between two of said interlayer surfaces, in which said top contact array is a ball grid array.

15. A package according to claim 14, in which at least two of said horizontal segments have substantially the same length.

16. A package according to claim 14, in which at last one of said horizontal segments has an increased width in proximity to a vertical member such that increased capacitance compensates for inductance of said vertical member.

17. A package according to claim 14, in which at least one signal line originates and terminates on a member of said top contact array.

18. A package according to claim 15, in which at least one signal line originates and terminates on a member of said top contact array.

19. A package according to claim 14, in which at least one signal line terminates on a contact on a vertical face of said package.

20. A package according to claim 15, in which at least one signal line terminates on a contact on a vertical face of said package.

21. A method of making a package for an integrated circuit comprising a set of dielectric layers having a top surface, a bottom surface and a plurality of interlayer surfaces; a top contact array attached to said top surface; a set of conductive signal lines extending through said package to a set of output contacts and disposed on said plurality of interlayer surfaces, comprising the steps of:

forming a set of dielectric layers containing horizontal segments of a plurality of signal lines in which at least one of said plurality of signal lines comprises at least three horizontal segments on at least two interlayer surfaces;

forming at least two vias extending vertically from the same horizontal segment at different horizontal locations between two of said interlayer surfaces, so that signals traveling on said signal lines pass consecutively through a first via, one of said at least three horizontal segments and a second of said at least two vias, and bonding said set of dielectric layers.

22. A method according to claim 21, further comprising a step of forming at least one of said horizontal segments with an increased width in proximity to a via such that increased capacitance compensates for via inductance.

23. A method according to claim 21, further comprising a step of forming at least two of said horizontal segments on adjacent interlayer surfaces so that said at least two horizontal segments are separated by a single dielectric layer.

* * * * *